United States Patent
Ji et al.

(10) Patent No.: US 11,569,302 B2
(45) Date of Patent: Jan. 31, 2023

(54) PIXEL ARRANGEMENT STRUCTURE AND DISPLAY SUBSTRATE

(71) Applicants: Chengdu BOE Optoelectronics Technology Co., Ltd., Chengdu (CN); BOE TECHNOLOGY GROUP CO., LTD., Beijing (CN)

(72) Inventors: Fengli Ji, Beijing (CN); Hongli Wang, Beijing (CN); Xueguang Hao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/908,935

(22) Filed: Jun. 23, 2020

(65) Prior Publication Data
US 2021/0399061 A1    Dec. 23, 2021

(51) Int. Cl.
*H01L 27/32* (2006.01)

(52) U.S. Cl.
CPC ...... *H01L 27/3218* (2013.01); *H01L 27/3216* (2013.01)

(58) Field of Classification Search
CPC .................................... H01L 27/3206–3218
See application file for complete search history.

(56) References Cited

U.S. PATENT DOCUMENTS

| 2013/0234917 | A1* | 9/2013 | Lee | ...................... H01L 27/3218 345/82 |
| 2016/0351116 | A1* | 12/2016 | Sun | ...................... G09G 3/2003 |
| 2019/0252469 | A1* | 8/2019 | Xiao | ...................... H01L 27/326 |
| 2020/0403044 | A1* | 12/2020 | Zhao | ...................... H01L 27/3218 |

FOREIGN PATENT DOCUMENTS

| CN | 109763094 A | 5/2019 |
| CN | 109935617 A | 6/2019 |
| CN | 209312770 U | 8/2019 |

OTHER PUBLICATIONS

Extended European Office Action in European Application No. 21180878.7 dated Nov. 24, 2021.

* cited by examiner

*Primary Examiner* — Eric K Ashbahian
(74) *Attorney, Agent, or Firm* — Collard & Roe, P.C.

(57) ABSTRACT

A pixel arrangement structure, a display substrate and a mask group are disclosed. The pixel arrangement structure includes a plurality of pixel groups, each of the plurality of pixel groups includes one red sub-pixel, two green sub-pixels and one blue sub-pixel; the red sub-pixel and the blue sub-pixel are arranged along a first direction; the two green sub-pixels are arranged along a second direction. Four vertexes included in the red sub-pixel are located in a first virtual rhombus and are substantially coincident with four vertexes of the first virtual rhombus, respectively; four vertexes included in the blue sub-pixel are located in a second virtual rhombus and are substantially coincident with four vertexes of the second virtual rhombus, respectively; at least one of the red or the blue sub-pixel has a shape of a corresponding virtual rhombus with each side of the virtual rhombus being an inwardly concaved side.

17 Claims, 5 Drawing Sheets

PIXEL ARRANGEMENT STRUCTURE AND DISPLAY SUBSTRATE

TECHNICAL FIELD

At least one embodiment of the present disclosure relates to a pixel arrangement structure and a display substrate.

BACKGROUND

At present, in mobile phone and flat panel display technology, organic light-emitting diode (OLED) displayers have gradually become the mainstream of next generation displayers for their advantages of self-illumination, vivid colors, low power consumption, wide viewing-angle and the like. Organic light-emitting diode includes active matrix organic light-emitting diode (AMOLED). As compared to conventional liquid crystal displayers, AMOLED displayers are self-luminous instead of adopting backlight sources. Organic light-emitting diode is formed by evaporating an organic material onto an array substrate, in which the organic material is evaporated onto an anode in an opening of a pixel definition layer (PDL) on the array substrate, and the opening of the pixel definition layer is configured to limit a size of an actual light-emitting area.

SUMMARY

At least one embodiment of the present disclosure provides a pixel arrangement structure and a display substrate.

At least one embodiment of the present disclosure provides a pixel arrangement structure, the pixel arrangement structure includes a plurality of pixel groups, each of the plurality of pixel groups includes one red sub-pixel, two green sub-pixels and one blue sub-pixel; the red sub-pixel and the blue sub-pixel are arranged along a first direction; the two green sub-pixels are arranged along a second direction; and a connecting line of a center of the red sub-pixel and a center of the blue sub-pixel is intersected with a connecting line of centers of the two green sub-pixels. Four vertexes included in the red sub-pixel are located in a first virtual rhombus and are substantially coincident with four vertexes of the first virtual rhombus, respectively; four vertexes included in the blue sub-pixel are located in a second virtual rhombus and are substantially coincident with four vertexes of the second virtual rhombus, respectively; at least one of the red sub-pixel or the blue sub-pixel has a shape of a corresponding virtual rhombus with each side of the corresponding virtual rhombus being an inwardly concaved side; a side of the green sub-pixel that is adjacent to the inwardly concaved side is protruded towards the inwardly concaved side; a vertex angle of the red sub-pixel and a vertex angle of the blue sub-pixel both are not larger than 90 degrees; the first virtual rhombus has a side length of M, the vertex angle of the red sub-pixel is $\alpha 1$, the green sub-pixel has a first size $\beta$ in a third direction which is perpendicular to a direction in which the adjacent red and green sub-pixels are arranged, and the vertex angle $\alpha 1$ of the red sub-pixel, the size $\beta$ and the side length M has the following relationship: $\tan[(90°-\alpha 1)/2] \leq (M-\beta)/M$; and the second virtual rhombus has a side length of N, the vertex angle of the blue sub-pixel is $\alpha 2$, the green sub-pixel has a second size $\gamma$ in a fourth direction which is perpendicular to a direction in which the adjacent blue and green sub-pixels are arranged, and the vertex angle $\alpha 2$ of the blue sub-pixel, the size $\gamma$ and the side length N has the following relationship: $\tan[(90°-\alpha 2)/2] \leq (N-\gamma)/N$.

For example, a minimum distance between a side of the red sub-pixel and a side of the green sub-pixel that are adjacent to each other is equal to a minimum distance between a side of the blue sub-pixel and a side of the green sub-pixel that are adjacent to each other.

For example, both the red sub-pixel and the blue sub-pixel have a shape of a corresponding virtual rhombus with each side of the corresponding virtual rhombus being inwardly concaved as a cambered side.

For example, a side of the green sub-pixel and a side of the red sub-pixel that are adjacent to each other have contours which are substantially complementary with each other; and a side of the green sub-pixel and a side of the blue sub-pixel that are adjacent to each other have contours which are substantially complementary with each other.

For example, both the red sub-pixel and the blue sub-pixel are centrosymmetric patterns.

For example, for the adjacent sides of the green sub-pixel and the red sub-pixel, the side of the green sub-pixel has a curvature larger than that of the side of the red sub-pixel; for the adjacent sides of the green sub-pixel and the blue sub-pixel, the side of the green sub-pixel has a curvature larger than that of the side of the blue sub-pixel.

For example, a vertex angle of the blue sub-pixel is smaller than a vertex angle of the red sub-pixel.

For example, a shape of the red sub-pixel and a shape of the blue sub-pixel are similar patterns.

For example, the green sub-pixel is an axisymmetric pattern.

For example, a shape of the green sub-pixel is roughly an oval shape.

For example, the green sub-pixel includes a long axis and a short axis; the long axis is parallel to an arrangement direction of the green sub-pixel and the red sub-pixel; and the short axis is parallel to an arrangement direction of the green sub-pixel and the blue sub-pixel.

For example, an area of each blue sub-pixel is greater than an area of each red sub-pixel.

For example, an area of each red sub-pixel is greater than an area of each green sub-pixel.

For example, the plurality of pixel groups are arranged along a direction parallel to the long axis and along a direction parallel to the short axis.

For example, for the green sub-pixel and the blue sub-pixel that are adjacent to each other, a connecting line that connects two points on adjacent sides of the green sub-pixel and the blue sub-pixel and that is parallel to a direction from a center of the green sub-pixel to a center of the blue sub-pixel has a length which is gradually increased in a direction from centers of the adjacent sides to both ends of the adjacent sides.

For example, a minimum distance between the red sub-pixel and the blue sub-pixel is equal to a minimum distance between a side of the red sub-pixel and a side of the green sub-pixel that are adjacent to each other.

For example, one of the red sub-pixel and the blue sub-pixel has a shape of a corresponding virtual rhombus with each side of the corresponding virtual rhombus being inwardly concaved as a cambered side, and a side of the other one of the red sub-pixel and the blue sub-pixel is substantially a straight side.

For example, each of the sub-pixels has a shape of a rounded pattern.

For example, two diagonal lines of the first virtual rhombus are parallel to the first direction and the second direction, respectively; and two diagonal lines of the second virtual rhombus are parallel to the first direction and the second direction, respectively.

For example, for the blue sub-pixel and the green sub-pixel that are adjacent to each other, a direction from a center of the green sub-pixel to a center of the blue sub-pixel is substantially perpendicular to the length direction of the green sub-pixel; and for the red sub-pixel and the green sub-pixel that are adjacent to each other, a direction from a center of the green sub-pixel to a center of the red sub-pixel is substantially perpendicular to the width direction of the green sub-pixel.

For example, for the blue sub-pixel and the green sub-pixel that are adjacent to each other, a minimum distance between two sides of the blue sub-pixel that are opposite to each other along the length direction of the green sub-pixel is greater than the maximum size of the green sub-pixel; and for the red sub-pixel and the green sub-pixel that are adjacent to each other, a minimum distance between two sides of the red sub-pixel that are opposite to each other along the width direction of the green sub-pixel is greater than the size of the green sub-pixel along the width direction.

For example, the vertex angle of the red sub-pixel is in a range from 64 degrees to 90 degrees, and the vertex angle of the blue sub-pixel is in a range from 60 degrees to 90 degrees.

At least one embodiment of the present disclosure provides a display substrate, including: a base substrate; and any of the above-described pixel arrangement structures located on the base substrate.

At least one embodiment of the present disclosure provides a pixel arrangement structure, the pixel arrangement structure includes a plurality of first sub-pixel rows and a plurality of second sub-pixel rows; each of the plurality of first sub-pixel rows includes a plurality of red sub-pixels and a plurality of green sub-pixels arranged alternately along a third direction sequentially, each of the plurality of second sub-pixels rows includes a plurality of blue sub-pixels and a plurality of green sub-pixels arranged alternately along the third direction sequentially; the plurality of first sub-pixel rows and the plurality of second sub-pixel rows are arranged alternately along a fourth direction perpendicular to the third direction; green sub-pixels in adjacent first sub-pixel row and second sub-pixel row are deviated from each other in the third direction. At least one of the red sub-pixel or the blue sub-pixel has a shape of a polygon with at least part of sides of the polygon being an inwardly concaved side; and a side of the green sub-pixel that is adjacent to the inwardly concaved side is protruded towards the inwardly concaved side.

For example, the green sub-pixel has a shape of elongated strip, the green sub-pixel has a maximum size in a length direction and the green sub-pixel has a minimum size in a width direction perpendicular to the length direction, the length direction of the green sub-pixel in the first sub-pixel row is parallel to the third direction, and the length direction of the green sub-pixel in the second sub-pixel row is parallel to the fourth direction.

BRIEF DESCRIPTION OF THE DRAWINGS

In order to clearly illustrate the technical solutions of the embodiments of the disclosure, the drawings of the embodiments will be briefly described in the following; it is obvious that the described drawings below are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Figure 1:
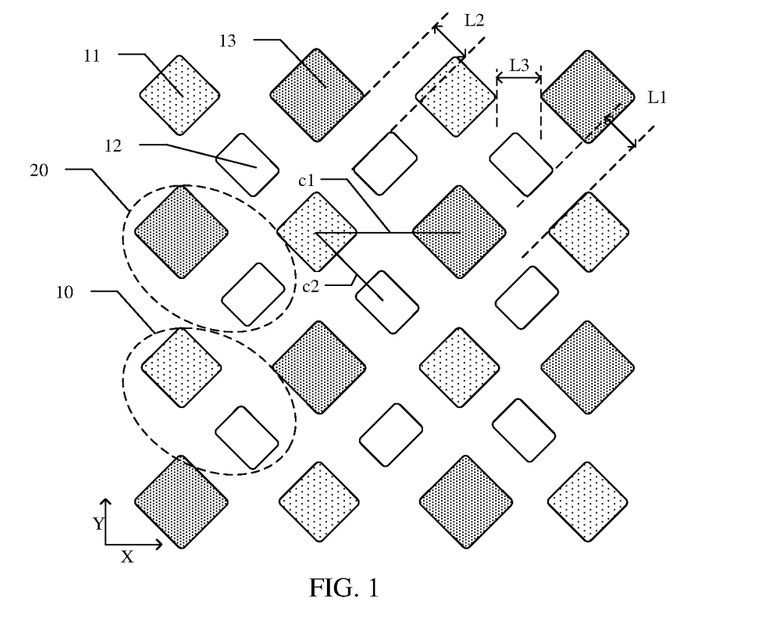
FIG. 1 is a schematic diagram of a pixel arrangement structure.

FIG. 1 is a structural diagram of a pixel arrangement structure. As illustrated in FIG. 1, the pixel arrangement structure includes a plurality of red sub-pixels 11, a plurality of green sub-pixels 12 and a plurality of blue sub-pixels 13. The pixel arrangement structure includes a plurality of first repetitive units 10 and a plurality of second repetitive units 20. Each of the plurality of first repetitive units 10 includes one red sub-pixel 11 and one green sub-pixel 12; each of the plurality of second repetitive units 20 includes one blue sub-pixel 13 and one green sub-pixel 12. The plurality of first repetitive units 10 are arranged alternately with the plurality of second repetitive units 20 along both the X direction and the Y direction; an arrangement direction of the red sub-pixel 11 and the green sub-pixel 12 in the first repetitive unit 10 is different from both the X direction and the Y direction; and an arrangement direction of the blue sub-pixel 13 and the green sub-pixel 12 in the second repetitive unit 20 is as same as the arrangement direction of the red sub-pixel 11 and the green sub-pixel 12 in the first repetitive unit 10. A plurality of red sub-pixels 11 are arranged alternately with a plurality of blue sub-pixels 13 along both the X direction and the Y direction; a plurality of green sub-pixels 12 are arranged in an array along the X direction and the Y direction; and every four green sub-pixels 12 surround one red sub-pixel 11 or one blue sub-pixel 13.

As illustrated in FIG. 1, an area of the blue sub-pixel 13 is greater than an area of the red sub-pixel 11; the area of the red sub-pixel 11 is greater than an area of the green sub-pixel 12. A length of a side of the green sub-pixel 12 adjacent to the blue sub-pixel 13 is greater than a length of a side of the green sub-pixel 12 adjacent to the red sub-pixel 11.

As illustrated in FIG. 1, an included angle between, a connecting line c2 of a center (geometric center) of the green sub-pixel 12 and a center (geometric center) of the red sub-pixel 11, and, a connecting line c1 of the center (geometric center) of the red sub-pixel 11 and a center (geometric center) of the blue sub-pixel 13 is 45 degrees. A shape of the red sub-pixel 11 and a shape of the blue sub-pixel 13 both are rhombus, and two diagonal lines of the rhombus extend along the X direction and the Y direction, respectively. A side of the red sub-pixel 11 and a side of the green sub-pixel 12 that are adjacent to each other are parallel to each other; a side of the green sub-pixel 12 and a side of the blue sub-pixel 13 that are adjacent to each other are parallel to each other; as a result, a distance L1 between the red sub-pixel 11 and the green sub-pixel 12 is a distance between the two sides parallel to each other, a distance L2 between the green sub-pixel 12 and the blue sub-pixel 13 is a distance between the two sides parallel to each other, and the distance L1 between the red sub-pixel 11 and the green sub-pixel 12 is equal to the distance L2 between the green sub-pixel 12 and the blue sub-pixel 13. Furthermore, a distance L3 between the red sub-pixel 11 and the blue sub-pixel 13 is a distance between the red sub-pixel 11 and the blue sub-pixel 13 along the X direction or the Y direction, and L3 is greater than L1. Due to technical restriction, the shape of the red sub-pixel 11 and the blue sub-pixel 13 may not strictly be a rhombus but roughly be a rhombus, for example, a rounded rhombus which is a shape formed by rounding angles of a rhombus. Similarly, the shape of the green sub-pixel 12 may not strictly be a rectangle but roughly be a rectangle, for example, a rounded rectangle which is a shape formed by rounding angles of a rectangle.

For example, each of the above-described red sub-pixel 11, green sub-pixel 12 and blue sub-pixel 13 includes a first electrode, a second electrode and a light-emitting layer located between the first electrode and the second electrode. For example, the first electrode may be an anode. Because the light-emitting layer only emits light at a portion in contact with the anode, the shape of the sub-pixel is a shape of the portion of the light-emitting layer in contact with the anode.

During research, inventor(s) of the present application found that, with the increasingly stricter requirements on resolution and brightness of display devices from users, a size of the pixel, an active light-emitting area and aperture ratios of the red sub-pixel, the blue sub-pixel and the green sub-pixel are all getting smaller and smaller. Therefore, a service life of product has become a bottleneck of OLED display industries.

An embodiment of the present disclosure provides a pixel arrangement structure and a display substrate. The pixel arrangement structure includes: a plurality of pixel groups, each of the plurality of pixel groups includes one red sub-pixel, two green sub-pixels and one blue sub-pixel, the red sub-pixel and the blue sub-pixel are arranged along a first direction, the two green sub-pixels are arranged along a second direction, and a connecting line of a center of the red sub-pixel and a center of the blue sub-pixel is intersected with a connecting line of centers of the two green sub-pixels. Four vertexes included in the red sub-pixel are located in a first virtual rhombus and are substantially coincident with four vertexes of the first virtual rhombus, respectively; four vertexes included in the blue sub-pixel are located in a second virtual rhombus and are substantially coincident with four vertexes of the second virtual rhombus, respectively; at least one of the red sub-pixel or the blue sub-pixel has a shape of a corresponding virtual rhombus with each side of the corresponding virtual rhombus being inwardly concaved; a side of the green sub-pixel and a side of the red sub-pixel that are adjacent to each other have contours which are substantially complementary with each other; a side of the green sub-pixel and a side of the blue sub-pixel that are adjacent to each other have contours which are substantially complementary with each other. By improving the shape of the pixel, the present disclosure can optimize the light-emitting area of the pixel and improve the service life of the display device. For example, "at least one of the red sub-pixel or the blue sub-pixel has a shape of a corresponding virtual rhombus with each side of the corresponding virtual rhombus being inwardly concaved" means that the red sub-pixel has a shape of the first virtual rhombus with each side being inwardly concaved; or the blue sub-pixel has a shape of the second virtual rhombus with each side being inwardly concaved; or the red sub-pixel has a shape of the first virtual rhombus with each side being inwardly concaved and the blue sub-pixel has a shape of the second virtual rhombus with each side being inwardly concaved.

Hereinafter, the pixel arrangement structure and the display substrate as provided by embodiments of the present disclosure will be described in connection with the drawings.

Figure 2A:
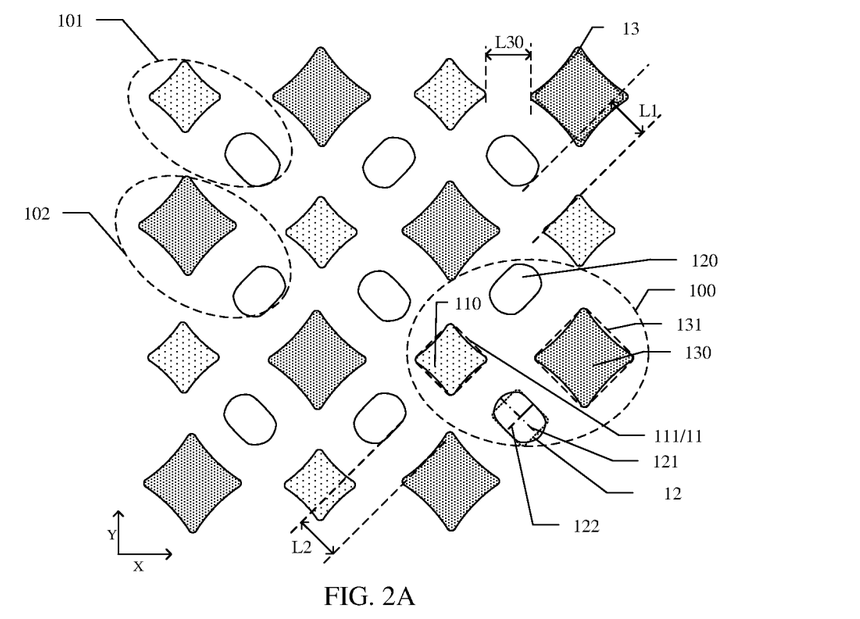
FIG. 2A is a partial plan view of a pixel arrangement structure provided by some embodiments of the present disclosure.

An embodiment of the present disclosure provides a pixel arrangement structure, and FIG. 2A is a partial plan view of a pixel arrangement structure provided by an example of the present embodiment. As illustrated in FIG. 2A, the pixel arrangement structure includes a plurality of pixel groups 100, each of the plurality of pixel groups 100 includes one red sub-pixel 110, two green sub-pixels 120 and one blue sub-pixel 130, the red sub-pixel 110 and the blue sub-pixel 130 are arranged along a first direction (the X direction as illustrated in the figure), the two green sub-pixels 120 are arranged along a second direction (the Y direction as illustrated in the figure), and a connecting line of a center (geometric center) of the red sub-pixel 110 and a center (geometric center) of the blue sub-pixel 130 is intersected with a connecting line of centers (geometric centers) of the two green sub-pixels 120, that is, the two green sub-pixels 120 are located at two sides of the connecting line of the center of the red sub-pixel 110 and the center of the blue sub-pixel 130 along the Y direction, respectively. Each of the pixel groups 100 is one repetitive unit, and the pixel arrangement structure includes a plurality of pixel groups 100 arranged along two directions which have an included angle of 45 degrees with respect to the X direction. For example, four sub-pixels in each of the pixel groups 100 constitute two pixels; one red sub-pixel 110 and one of the two green sub-pixels 120 constitute one pixel, and one blue sub-pixel 130 and the other one of the two green sub-pixels 120 constitute one pixel; the red sub-pixel 110 and the blue sub-pixel 130 are shared by two pixels, respectively.

The arrangement manner of the pixel arrangement structure illustrated in FIG. 2A is as same as that of the pixel arrangement structure illustrated in FIG. 1; that is, the plurality of red sub-pixels 110, the plurality of green sub-pixels 120 and the plurality of blue sub-pixels 130 included in the pixel arrangement structure illustrated in FIG. 2A are arranged as a plurality of first repetitive units 101 and a plurality of second repetitive units 102, each of the plurality of first repetitive units 101 includes one red sub-pixel 110 and one green sub-pixel 120, and each of the plurality of second repetitive units 102 includes one blue sub-pixel 130 and one green sub-pixel 120. The plurality of first repetitive units 101 are arranged alternately with the plurality of second repetitive units 102 along both the X direction and the Y direction. The plurality of red sub-pixels 101 are arranged alternately with the plurality of blue sub-pixels 130 along both the X direction and the Y direction; the plurality of green sub-pixels 120 are arranged in an array along the X direction and the Y direction; and every four green sub-pixels 120 surround one red sub-pixel 110 or one blue sub-pixel 130.

As illustrated in FIG. 2A, four vertexes included in the red sub-pixel 110 are located in a first virtual rhombus 111 and are substantially coincident with four vertexes of the first virtual rhombus 111, respectively; four vertexes included in the blue sub-pixel 130 are located in a second virtual rhombus 131 and are substantially coincident with four vertexes of the second virtual rhombus 131, respectively. At least one of the red sub-pixel 110 or the blue sub-pixel 130 has a shape of a corresponding virtual rhombus with each side of the corresponding virtual rhombus being inwardly concaved; a side of the green sub-pixel 120 and a side of the red sub-pixel 110 that are adjacent to each other have contours which are substantially complementary with each other; a side of the green sub-pixel 120 and a side of the blue sub-pixel 130 that are adjacent to each other have contours which are substantially complementary with each other. The above-mentioned "at least one of the red sub-pixel 110 or the blue sub-pixel 130 has a shape of a corresponding virtual rhombus with each side of the corresponding virtual rhombus being inwardly concaved" includes the case where part of red sub-pixels have a shape of a corresponding virtual rhombus with each side being inwardly concaved, and/or, the case where part of blue sub-pixels have a shape of a corresponding virtual rhombus with each side being inwardly concaved; or the case where all the red sub-pixels have a shape of a corresponding virtual rhombus with each side being inwardly concaved, and all the blue sub-pixels have a shape of a corresponding virtual rhombus with each side being inwardly concaved.

The foregoing is described with reference to the case where the side of the green sub-pixel and the side of the red sub-pixel that are adjacent to each other have contours which are substantially complementary with each other, and the side of the green sub-pixel and the side of the blue sub-pixel that are adjacent to each other have contours which are substantially complementary with each other, by way of example. However, the embodiments according to the present disclosure are not particularly limited. For example, the space can be sufficiently utilized by each of the sub-pixels as long as the side of the green sub-pixel that is adjacent to the inwardly concaved side is protruded towards the inwardly concaved side, thereby maximizing the light-emitting area of each of the sub-pixels in the limited space.

Moreover, it should be explained that, the drawings are described with reference to the case where the side having a protruded shape and the side having an inwardly concaved shape have a substantially cambered shape, by way of example. However, the embodiments of the present disclosure are not limited thereto, and the side having a protruded shape and the side having an inwardly concaved shape may also have a fold line shape or other curved shapes between the cambered shape and the fold line shape.

In the example as illustrated in FIG. 2A, the red sub-pixel 110 and the blue sub-pixel 130 both have a shape of a corresponding virtual rhombus with each side being inwardly concaved.

Herein, each of the sub-pixels includes, for example, a first electrode, a second electrode and a light-emitting layer located between the first electrode and the second electrode. For example, the first electrode may be an anode. Because the light-emitting layer only emits light at a portion in contact with the anode, the shape of the sub-pixel is a shape of the portion of the light-emitting layer in contact with the anode. For example, in the embodiment of the present disclosure, the shape of the sub-pixel refers to the shape of the effective light-emitting area of the sub-pixel. For example, the shape of the sub-pixel is a planar shape of an opening of a pixel definition layer of the sub-pixel.

In some examples, the above-mentioned "a side of the green sub-pixel 120 and a side of the red sub-pixel 110 that are adjacent to each other have contours which are substantially complementary with each other, and a side of the green sub-pixel 120 and a side of the blue sub-pixel 130 that are adjacent to each other have contours which are substantially complementary with each other" refers to that, a side of the green sub-pixel 120 and a side of the red sub-pixel 110 that are adjacent to each other are substantially parallel to each other. For example, among sides of adjacent sub-pixels that are adjacent to each other, one side is an inwardly concaved side and the other side is an outwardly protruded side, so as to allow adjacent sides of adjacent sub-pixels to be complementary with each other. Furthermore, the term "complementary" in the embodiments of the disclosure is not limited to the case of being parallel to each other as mentioned above, and it can include the case the complementary adjacent sides are not parallel to each other. As long as one of the adjacent sides is inwardly concaved, and the other one is outwardly protruded, then it can be considered that they are complementary with each other.

In FIG. 2A, the red sub-pixel 110, the green sub-pixel 120 and the blue sub-pixel 130 each are a pattern delimited by solid lines, and the first virtual rhombus 111 (the second virtual rhombus 131) is a rhombus delimited by dotted lines located at a periphery of the red sub-pixel 110 (blue sub-pixel 130).

In an actual process, due to technical restriction, angles at four vertexes of the red sub-pixel 110 and angles at four vertexes of the blue sub-pixel 130 may be rounded angles; the first virtual rhombus 111 that takes the four vertexes of the red sub-pixel 110 as its vertexes may not strictly be a rhombus but roughly be a rhombus, for example, it may be a rounded rhombus which is a shape formed by rounding angles of a rhombus. Similarly, the second virtual rhombus 131 that takes the four vertexes of the blue sub-pixel 130 as its vertexes may not strictly be a rhombus but roughly be a rhombus. In such case, two vertexes of the red sub-pixel 110 (blue sub-pixel 130) in the X direction are two points thereof having the maximum distance there-between in the X direction; similarly, two vertexes of the red sub-pixel 110 (blue sub-pixel 130) in the Y direction are two points thereof having the maximum distance there-between in the Y direction. FIG. 2A illustrates the case where the red sub-pixel and the blue sub-pixel have rounded patterns, and the first virtual rhombus and the second virtual rhombus are rounded rhombuses, by way of example. Because the red sub-pixel and the blue sub-pixel have rounded patterns, and because the first virtual rhombus and the second virtual rhombus are rounded rhombuses, the vertexes of the virtual rhombus and the vertexes of the sub-pixel have substantially the same positions, with slight deviations, probably.

For example, as illustrated in FIG. 2A, two diagonal lines of the first virtual rhombus 111 and two diagonal lines of the second virtual rhombus 131 are parallel to the first direction and the second direction, respectively; that is, two diagonal lines of the first virtual rhombus 111 extend along the X direction and the Y direction, respectively, and two diagonal lines of the second virtual rhombus 131 extend along the X direction and the Y direction, respectively.

FIG. 1 is a partial planar structural view of an original pixel arrangement structure, and each side of each of the sub-pixels of various colors in the original pixel arrangement structure is a straight side. The present example illustrated in FIG. 2A includes modifications based on the shapes of the sub-pixels of various colors in the original pixel arrangement structure.

For example, the side of the red sub-pixel 110 illustrated in FIG. 2A is a side obtained by designing the straight side of the red sub-pixel 11 illustrated in FIG. 1 as an inwardly concaved, cambered side; furthermore, as compared to the red sub-pixel 11 illustrated in FIG. 1, positions of the four vertexes of the red sub-pixel 110 illustrated in FIG. 2A remain unchanged. The red sub-pixel 11 illustrated in FIG. 1 is a bounding rhombus of the red sub-pixel 110 illustrated in FIG. 2A. A contour of the red sub-pixel illustrated in FIG. 1 is substantially coincident with a contour of the first virtual rhombus 111 at a periphery of the red sub-pixel 110 illustrated in FIG. 2A. In this way, an area of the red sub-pixel 110 illustrated in FIG. 2A is smaller than an area of the red sub-pixel 11 illustrated in FIG. 1. Because the side of the green sub-pixel 120 and the side of the red sub-pixel 110 that are adjacent to each other have substantially complemented contours, the side of the green sub-pixel 120 that is adjacent to the red sub-pixel 110, as illustrated in FIG. 2A, is a side obtained by designing the straight side of the green sub-pixel 12 illustrated in FIG. 1 as an outwardly protruded, cambered side. The contour of the green sub-pixel 12 illustrated in FIG. 1 is presented, in the form of a dotted-line box, on the green sub-pixel 120 illustrated in FIG. 2A.

For example, the side of the blue sub-pixel 130 illustrated in FIG. 2A is a side obtained by remaining a central point of the side of the blue sub-pixel 13 illustrated in FIG. 1 unchanged and by outwardly curving portions located at both sides of the central point to form a cambered side; that is, the blue sub-pixel 13 illustrated in FIG. 1 is an inscribed rhombus of the blue sub-pixel 130 illustrated in FIG. 2A. The contour of the blue sub-pixel 13 illustrated in FIG. 1 is presented, in the form of a dotted-line box, on the blue sub-pixel 130 illustrated in FIG. 2A. In this way, an area of the blue sub-pixel 130 illustrated in FIG. 2A is greater than an area of the blue sub-pixel 13 illustrated in FIG. 1. Because the side of the green sub-pixel 120 and the side of the blue sub-pixel 130 that are adjacent to each other have substantially complemented contours, the side of the green sub-pixel 120 that is adjacent to the blue sub-pixel 130, as illustrated in FIG. 2A, is a side obtained by designing the straight side of the green sub-pixel 12 illustrated in FIG. 1 as a cambered side, and a center of the cambered side is coincident with a center of the original, straight side.

Because a distance between sub-pixels of different colors is correlated to the service life of the display device, generally, the smaller the distance between sub-pixels of different colors is, the larger the area of the light-emitting region of the sub-pixel will be, and the longer the service life of the product is. However, an excessively small distance between sub-pixels of different colors may result in color mixture phenomenon. Therefore, in order to balance the service life of the display device and the distance between sub-pixels of different colors, the distance between sub-pixels of different colors in the pixel arrangement structure illustrated in FIG. 2A is designed to be the same with the distance between sub-pixels of different colors in the pixel arrangement structure illustrated in FIG. 1. That is, when the shapes of light-emitting regions of the red sub-pixel and the green sub-pixel are designed as those illustrated in FIG. 2A, the distance between the red sub-pixel 110 and the green sub-pixel 120 should be equal to the distance between the red sub-pixel 11 and the green sub-pixel 12 illustrated in FIG. 1; i.e., although the shape of the red sub-pixel and shape of the green sub-pixel have been changed, the distance between the red sub-pixel and the green sub-pixel still remains as L1. After changing the shapes of the light-emitting regions of the red sub-pixel and the green sub-pixel, as compared to the pixel arrangement structure illustrated in FIG. 1, the area of the light-emitting region of the red sub-pixel is decreased, i.e., the aperture ratio thereof is decreased, while the area of the light-emitting region of the green sub-pixel is increased, i.e., the aperture ratio thereof is increased, thereby improving the service life of the display device.

Similarly, when the shapes of light-emitting regions of the blue sub-pixel and the green sub-pixel are designed as those illustrated in FIG. 2A, the distance between the blue sub-pixel 130 and the green sub-pixel 120 should be equal to the distance between the blue sub-pixel 13 and the green sub-pixel 12 illustrated in FIG. 1; i.e., although the shape of the blue sub-pixel and shape of the green sub-pixel have been changed, the distance between the blue sub-pixel and the green sub-pixel still remains as L2. After changing the shapes of the light-emitting regions of the blue sub-pixel and the green sub-pixel, as compared to the pixel arrangement structure illustrated in FIG. 1, the area of the light-emitting region of the blue sub-pixel is increased, i.e., the aperture ratio thereof is increased, thereby improving the service life of the display device.

For example, as illustrated in FIG. 2A, after changing the shape of the green sub-pixel 120 in the present example as compared to the green sub-pixel 12 illustrated in FIG. 1, the green sub-pixel 120 in the present example has a roughly oval shape.

For example, as illustrated in FIG. 2A, after changing the shape of the green sub-pixel 120 in the present example, the area and also the aperture ratio of the green sub-pixel 120 are increased as compared to the green sub-pixel 12 illustrated in FIG. 1, thereby improving the service life of the display device.

The present example illustrates the case where the contours of the light-emitting regions of the sub-pixels of various colors are changed from straight sides to cambered sides, by way of example, without limited thereto. It may also be possible that, the contours of the light-emitting regions of the sub-pixels of various colors are changed from straight sides to fold line sides, as long as the red sub-pixel and the blue sub-pixel have a shape of a corresponding virtual rhombus with each side being inwardly concaved, the side of the green sub-pixel and the side of the red sub-pixel that are adjacent to each other have contours which are substantially complementary with each other, the area of the red sub-pixel is decreased, and the areas of the blue sub-pixel and the green sub-pixel are increased.

For example, as illustrated in FIG. 2A, a minimum distance between the side of the red sub-pixel 110 and the side of the green sub-pixel 120 that are adjacent to each other is substantially equal to a minimum distance between the side of the blue sub-pixel 130 and the side of the green sub-pixel 120 that are adjacent to each other, i.e., L1=L2. The expression of "substantially equal to" used herein and appeared subsequently includes "exactly equal to" and "approximately equal to", and "approximately equal to" refers to that a ratio of the two distances is in the range from 0.95 to 1.05.

In the pixel arrangement structure illustrated in FIG. 1, the distance L1 between the red sub-pixel 11 and the green sub-pixel 12 is smaller than the distance L3 between the red sub-pixel 11 and the blue sub-pixel 13. In the present example, by changing the positions of the four vertexes of the blue sub-pixel, the blue sub-pixel is extended to a gap between the blue sub-pixel and the red sub-pixel to decrease the distance there-between as compared to the structure illustrated in FIG. 1, so as to increase the aperture ratio at the positions of the vertexes of the red and blue sub-pixels.

For example, as illustrated in FIG. 2A, a minimum distance L30 between the red sub-pixel 110 and the blue sub-pixel 130 is substantially equal to the minimum distance L1 between the red sub-pixel 110 and the green sub-pixel 120, i.e., the distance L30 between the red sub-pixel 110 and the blue sub-pixel 130 in the present example is smaller than the distance L3 between the red sub-pixel 11 and the blue sub-pixel 13 illustrated in FIG. 1; in this way, the distance between sub-pixels of different colors is the same, so as to increase the aperture ratio of the pixels and hence to improve the service life of the display device.

For example, as illustrated in FIG. 2A, both the red sub-pixel 110 and the blue sub-pixel 130 are centrosymmetric patterns, i.e., sides of the red sub-pixel 110 have the same length and the same curvature, and sides of the blue sub-pixel 130 have the same length and the same curvature.

For example, as illustrated in FIG. 2A, the shape of the red sub-pixel 110 and the shape of the blue sub-pixel 130 are shape-similar patterns, the term "shape similar patterns" here refers to patterns having similar shapes.

For example, as illustrated in FIG. 2A, the green sub-pixel 120 is an axisymmetric pattern, the green sub-pixel 120 includes a long axis 121 and a short axis 122, the long axis 121 is parallel to the arrangement direction of the green sub-pixel 120 and the red sub-pixel 110, and the short axis 122 is parallel to the arrangement direction of the green sub-pixel 120 and the blue sub-pixel 130. The plurality of pixel groups 100 are arranged along a direction parallel to the long axis 121 and a direction parallel to the short axis 122.

For example, as illustrated in FIG. 2A, because the service life of blue light-emitting material is short as compared to red light-emitting material, an area of each of the blue sub-pixels 130 is greater than that of each of the red sub-pixels 110, so as to improve the service life of the display device.

For example, as illustrated in FIG. 2A, the area of each of the red sub-pixels 110 is greater than the area of each of the green sub-pixels 120.

Figure 2B:
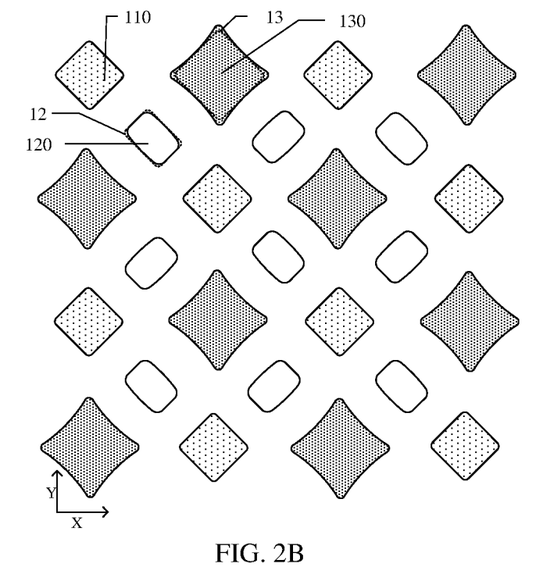
FIG. 2B is a partial plan view of a pixel arrangement structure provided by some embodiments of the present disclosure.

FIG. 2B is a partial plan view of a pixel arrangement structure provided by another example of the present embodiment. As illustrated in FIG. 2B, the present example is different from the example illustrated in FIG. 2A in that: in the present example, one of the red sub-pixel 110 and the blue sub-pixel 130 has a shape of a corresponding virtual rhombus with each side being inwardly concaved as a cambered side, and the other one of the red sub-pixel 110 and the blue sub-pixel 130 has a shape with each side substantially being a straight side.

As illustrated in FIG. 2B, the red sub-pixel 110 in the present example is as same as the red sub-pixel 11 illustrated in FIG. 1, i.e., the shape of the red sub-pixel 110 in the present example remains unchanged, the sides thereof are still straight sides, and the light-emitting area thereof is not changed, either. However, the side of the blue sub-pixel 130 in the present example is obtained by remaining the position of the central point of the side of the blue sub-pixel 13 illustrated in FIG. 1 unchanged and by outwardly curving portions located at both sides of the central point to form a cambered side; that is, the blue sub-pixel 13 illustrated in FIG. 1 is an inscribed rhombus of the blue sub-pixel 130 illustrated in FIG. 2B. The contour of the blue sub-pixel 13 illustrated in FIG. 1 is presented, in the form of a dotted-line box, in the blue sub-pixel 130 illustrated in FIG. 2B. In this way, the area of the blue sub-pixel 130 illustrated in FIG. 2A is greater than the area of the blue sub-pixel 13 illustrated in FIG. 1.

Because the side of the green sub-pixel 120 and the side of the blue sub-pixel 130 that are adjacent to each other have contours which are substantially complementary with each other, the side of the green sub-pixel 120 that is adjacent to the blue sub-pixel 130 illustrated in FIG. 2B is obtained by designing the straight side of the green sub-pixel 12 illustrated in FIG. 1 as a cambered side, with the center of the cambered side being coincident with the center of the original, straight side. After changing the shape of the light-emitting region of the blue sub-pixel, as compared to the pixel arrangement structure illustrated in FIG. 1, the area of the light-emitting region of the blue sub-pixel is increased, i.e., the aperture ratio is increased, thereby improving the service life of the display device.

In an actual process, due to technical restriction, the shape of the green sub-pixel may not strictly be a rectangle but a rounded rectangle with four angles being rounded as rounded angles. As a result, when the shape of the blue sub-pixel is changed into the shape illustrated in FIG. 2B, it can be ensured that the side of the green sub-pixel and the side of the blue sub-pixel adjacent to each other have shapes which are substantially complementary with each other, without changing the shape of the green sub-pixel.

In the present example, by changing the shape of the blue sub-pixel, it cannot only increase the aperture ratio of the blue sub-pixel so as to improve the service life of the display device but also decrease the distance between the blue sub-pixel and the red sub-pixel so as to increase the aperture ratio at positions of the vertexes of the blue and red sub-pixels.

Figure 2C:
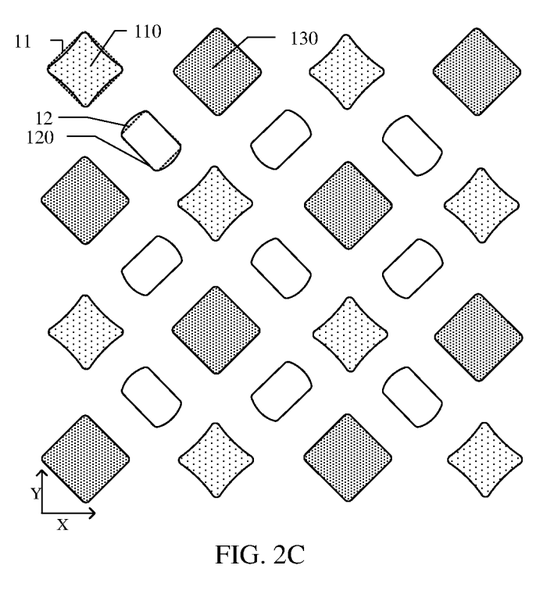
FIG. 2C is a partial plan view of a pixel arrangement structure provided by some embodiments of the present disclosure.

FIG. 2C is a partial plan view of a pixel arrangement structure provided by another example of the present embodiment. As illustrated in FIG. 2C, the present example is different from the example illustrated in FIG. 2A in that, in the present example, one of the red sub-pixel 110 and the blue sub-pixel 130 has a shape of a corresponding virtual rhombus with each side being inwardly concaved as a cambered side, and the other one of the red sub-pixel 110 and the blue sub-pixel 130 has a shape with each side substantially being a straight side.

As illustrated in FIG. 2C, the blue sub-pixel 130 in the present example is as same as the blue sub-pixel 13 illustrated in FIG. 1, i.e., the shape of the blue sub-pixel 130 in the present example remains unchanged, the sides thereof are still straight sides, and the light-emitting area thereof is not changed, either. However, the side of the red sub-pixel 110 in the present example is obtained by designing the straight side of the red sub-pixel 11 illustrated in FIG. 1 as an inwardly concaved, cambered side, with the positions of the four vertexes of the red sub-pixel 110 illustrated in FIG. 2C remaining unchanged as compared to the red sub-pixel 11 illustrated in FIG. 1, i.e., the red sub-pixel 11 illustrated in FIG. 1 is a bounding rhombus of the red sub-pixel 110 illustrated in FIG. 2C. The contour of the red sub-pixel 11 illustrated in FIG. 1 is substantially coincident with the contour of the first virtual rhombus 111 at a periphery of the red sub-pixel 110 illustrated in FIG. 2C. In this way, the area of the red sub-pixel 110 illustrated in FIG. 2C is smaller than the area of the red sub-pixel 11 illustrated in FIG. 1.

Because the side of the green sub-pixel 120 and the side of the red sub-pixel 110 that are adjacent to each other have contours which are substantially complementary with each other, the side of the green sub-pixel 120 that is adjacent to the red sub-pixel 110 as illustrated in FIG. 2C is obtained by designing the straight side of the green sub-pixel 12 illustrated in FIG. 1 as an outwardly protruded, cambered side. The contour of the green sub-pixel 12 illustrated in FIG. 1 is presented, in the form of a dotted-line box, on the green sub-pixel 120 illustrated in FIG. 2A.

After changing the shapes of the light-emitting regions of the red sub-pixel and the green sub-pixel, as compared to the pixel arrangement structure illustrated in FIG. 1, the area of the light-emitting region of the red sub-pixel is decreased, i.e., the aperture ratio thereof is decreased, while the area of the light-emitting region of the green sub-pixel is increased, i.e., the aperture ratio thereof is increased, thereby improving the service life of the display device.

Figure 3:
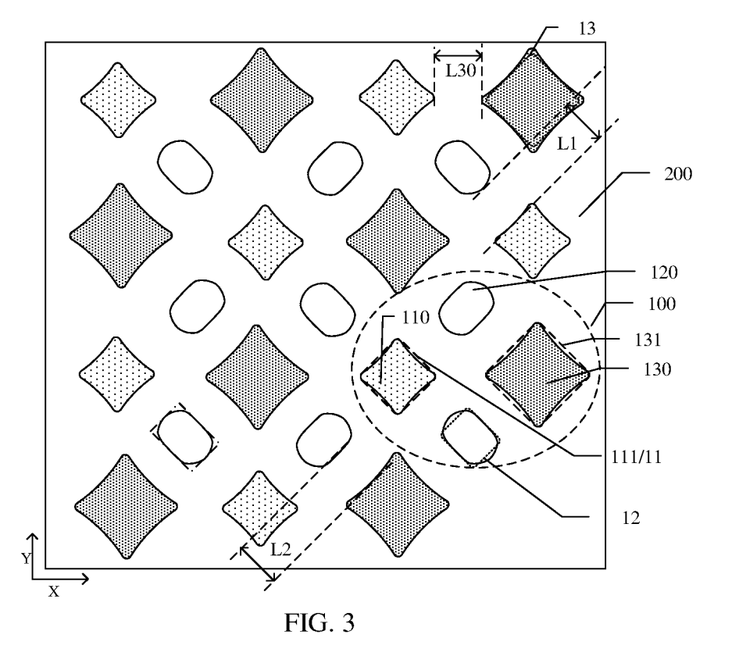
FIG. 3 is a partial planar structural view of a display substrate provided by some embodiments of the present disclosure.

FIG. 3 is a partial planar structural view of a display substrate provided by another embodiment of the present disclosure. As illustrated in FIG. 3, the display substrate provided by the present embodiment includes a base substrate 200 and a pixel arrangement structure located on the base substrate 200. The pixel arrangement structure illustrated in FIG. 3, by way of example, is the pixel arrangement structure illustrated in FIG. 2A, without limited thereto, and may also be the pixel arrangement structure illustrated in FIG. 2B or FIG. 2C.

When the display substrate provided by the present embodiment is adopted, by optimizing the shapes of the light-emitting regions of the sub-pixels of different colors in the pixel arrangement structure, the service life of the product can be improved.

For example, it's possible to decrease the area of the light-emitting region of the red sub-pixel and increase the area of the light-emitting region of the green sub-pixel, so as to improve the service life of the display device. Alternatively, it's possible to increase the area of the light-emitting region of the blue sub-pixel, so as to improve the service life of the display device. Alternatively, it's possible to decrease the area of the light-emitting region of the red sub-pixel and increase the areas of the light-emitting regions of the blue sub-pixel and the green sub-pixel, so as to improve the service life of the display device.

For example, the present embodiment further provides a display device including the above-described display substrate, the display device is an organic light-emitting diode (OLED) display device, and the display device is applicable in any product or component having display function such as television, digital camera, mobile phone, watch, tablet computer, notebook computer and navigation device, without limiting the embodiments of the present disclosure thereto.

Figure 4:
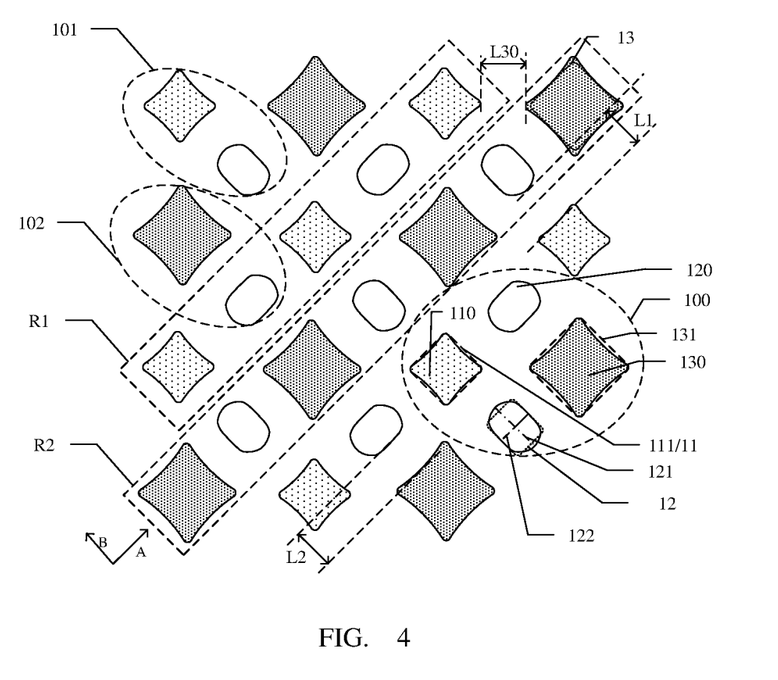
FIG. 4 is a partial plan view of a pixel arrangement structure provided by some embodiments of the present disclosure.

FIG. 4 is a planar structural view of a pixel arrangement structure according to some embodiments of the present disclosure. As illustrated in FIG. 4, the pixel arrangement structure in the present embodiment includes a plurality of first sub-pixel rows R1 and a plurality of second sub-pixel rows R2. Because FIG. 4 merely is a partial plan view of the pixel arrangement structure, each of the sub-pixel rows may also be partly illustrated only. Each of the first sub-pixel rows R1 includes a plurality of red sub-pixels 110 alternately arranged with a plurality of green sub-pixels 120 along a third direction A; each of the second sub-pixel rows R2 includes a plurality of blue sub-pixels 130 alternately arranged with a plurality of green sub-pixels 120 along the third direction A; the plurality of first sub-pixel rows R1 are alternately arranged with the plurality of second sub-pixel rows R2 along a fourth direction B perpendicular to the third direction A.

As illustrated in FIG. 4, green sub-pixels in adjacent first sub-pixel row R1 and second sub-pixel row R2 are deviated from each other in the third direction. For example, corresponding green sub-pixels in a plurality of first sub-pixel rows R1 are aligned with each other in the fourth direction, and corresponding green sub-pixels in a plurality of second sub-pixel rows R2 are aligned with each other in the fourth direction.

For another example, a center of at least one green sub-pixel in the first sub-pixel row R1 and a center of at least one blue sub-pixel in the second sub-pixel row R2 are aligned with each other in the fourth direction; a center of at least one green sub-pixel in the second sub-pixel row R2 and a center of at least one red sub-pixel in the first sub-pixel row R1 are aligned with each other in the fourth direction.

As illustrated in FIG. 4, the green sub-pixel in the first sub-pixel row R1 has a long axis parallel to the third direction, that is, parallel to the arrangement direction of the sub-pixels in this sub-pixel row; while the green sub-pixel in the second sub-pixel row R2 has a long axis parallel to the fourth direction, that is, perpendicular to the arrangement direction of the sub-pixels in this sub-pixel row. Because the area of the blue sub-pixel is greater than the area of the red sub-pixel, a spaced distance between adjacent blue sub-pixels is smaller than a spaced distance between adjacent red sub-pixels; by adopting the above-described different arrangement manners in different sub-pixel rows, it can improve an area occupancy rate of the sub-pixels, thereby improving the service life of the display device.

The pixel arrangement structure in the embodiment illustrated in FIG. 4, actually, is basically the same with the pixel arrangement structure in the embodiment illustrated in FIG. 2A. Therefore, except the reference signs A, B, R1 and R2, the other reference signs identical with those in FIG. 2A have the same meanings with those in the embodiment of FIG. 2A. Moreover, the limitations to various shapes of red, green and blue sub-pixels are also as same as those in the above-described embodiments, thus the repetitive portions will not be described herein.

Figure 5A:
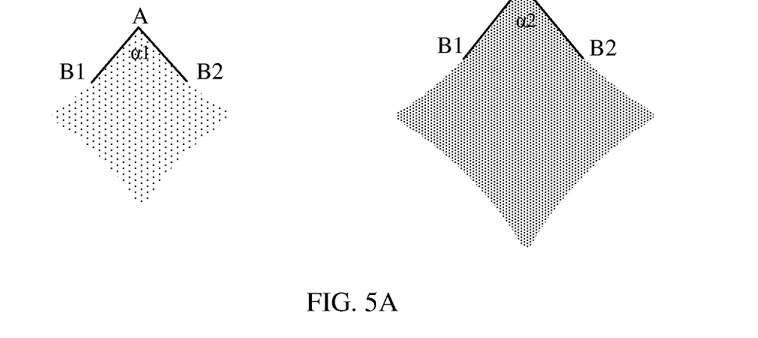
FIGS. 5A and 5B are planar structural views of a red sub-pixel and a green sub-pixel provided by some embodiments of the present disclosure.

FIG. 5A is a planar structural view of a red sub-pixel and a green sub-pixel according to an embodiment of the present disclosure. As illustrated in FIG. 5A, each of the red sub-pixel and the blue sub-pixel includes four vertex angles. For example, each of the vertex angles is an included angle between connecting lines AB1 and AB2, wherein the connecting line AB1 is a line between a vertex A and a central point of one of the two sides connected with the vertex A, and the connecting line AB2 is a line between the vertex A and a central point of the other one of the two sides connected with the vertex A. As it can be seen from FIG. 5A, the vertex angle of the red sub-pixel is a1, and the vertex angle of the blue sub-pixel is α2. In some embodiments, the vertex angle α1 of the red sub-pixel is greater than the vertex angle α2 of the blue sub-pixel. For example, all the four vertex angles of the red sub-pixel are equal to one another. For example, all the four vertex angles of the blue sub-pixel are equal to one another.

Figure 6:
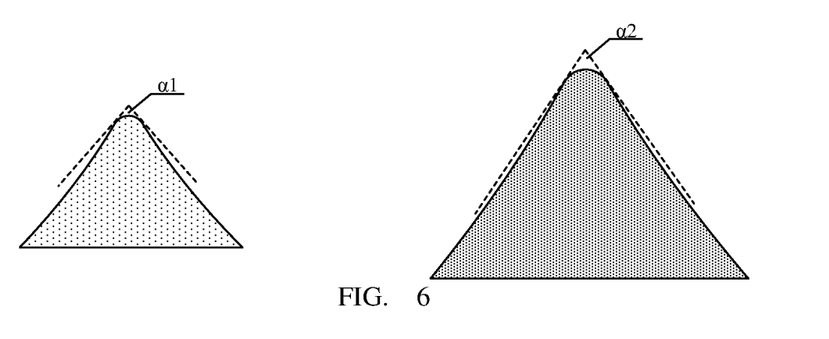
FIG. 6 is a planar structural view of a red sub-pixel and a green sub-pixel provided by some embodiments of the present disclosure.

FIG. 6 is a planar structural view of a red sub-pixel and a green sub-pixel according to an embodiment of the present disclosure. As illustrated in FIG. 6, each of the red sub-pixel and the blue sub-pixel includes four vertex angles and has a rounded pattern. For example, in each of the sub-pixels, a portion where the cambered side is connected with a camber line of the rounded angle has an indefinitely great curvature radius, and an included angle between tangent lines of two sides of each of the rounded angles at the position having the indefinitely great curvature radius is an angle of the vertex angle. As it can be seen from FIG. 6, the vertex angle of the red sub-pixel is a1, and the vertex angle of the blue sub-pixel is α2. In some embodiments, the vertex angle α1 of the red sub-pixel is greater than the vertex angle α2 of the blue sub-pixel. It should be explained that, in order to clearly illustrate related structures, FIG. 6 merely illustrates partial structures of the red sub-pixel and the blue sub-pixel.

In some examples, in case the above relationship between the angle α1 and the angle α2 is satisfied, both the angle α1 and the angle α2 are larger than or equal to 70 degrees and less than 90 degrees. In some other examples, both the angle α1 and the angle α2 are larger than or equal to 80 degrees and less than 90 degrees.

It should be explained that, the red sub-pixel and the blue sub-pixel illustrated in FIG. 5A and FIG. 6 are applicable for the pixel arrangement structure described in any of the embodiments above.

Figure 7:
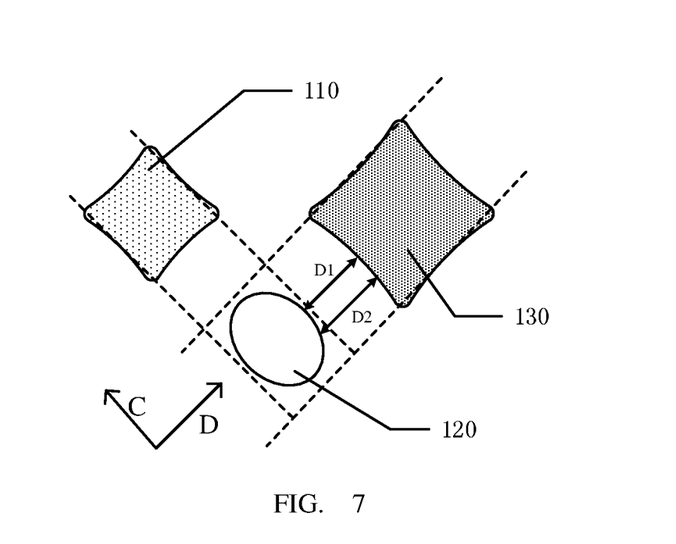
FIG. 7 is a partial plan view of a pixel arrangement structure provided by some embodiments of the present disclosure.

FIG. 7 is a partial plan view of a pixel arrangement structure according to an embodiment of the present disclosure. In order to clearly illustrate positional relationships between the red sub-pixel, the green sub-pixel and the blue sub-pixel that are adjacent to each other, FIG. 7 merely illustrates three sub-pixels of different colors. As illustrated in FIG. 7, the green sub-pixel has an oval shape, but the embodiments of the present disclosure are not limited thereto, and the green sub-pixel may have other suitable shapes such as elongated strip shape. For example, the green sub-pixel 120 has a maximum size in a length direction C, and the length direction C and the width direction D are substantially perpendicular to each other. In the case where the green sub-pixel has an oval shape, the length direction C is a long axis direction of the oval and the width direction D is a short axis direction of the oval. Moreover, the above-mentioned length direction C may be one of the third direction A and the fourth direction B in the above-described embodiments, and the width direction D may be the other one of the third direction A and the fourth direction B in the above-described embodiments.

As illustrated in FIG. 7, for the blue sub-pixel 130 and the green sub-pixel 120 adjacent to each other, a direction from a center of the green sub-pixel 120 to a center of the blue sub-pixel 130 is substantially perpendicular to the length direction C. For example, referring to FIG. 4 and FIG. 7, the width direction D is a direction in which the blue sub-pixels and the green sub-pixels are alternately arranged. For the red sub-pixel 110 and the green sub-pixel 120 adjacent to each other, a direction from the center of the green sub-pixel 120 to a center of the red sub-pixel 110 is substantially perpendicular to the width direction D of the green sub-pixel 120. With such arrangement, it may maximize a space occupancy rate of the active light-emitting area of the sub-pixels.

For example, as shown in FIG. 7, the connecting line between the centers of the adjacent sides of the blue sub-pixel 130 and the green sub-pixel 120 has a length of D1, and at a side of the centers of the adjacent sides, the connecting line along the width direction D1 has a length of D2. As shown in FIG. 7, the length D2 is larger than the length D1. For example, for the green sub-pixel 120 and the blue sub-pixel 130 adjacent to each other, the connecting line between two points at the adjacent sides of the green sub-pixel 120 and the blue sub-pixel 130 and parallel to the width direction D has a length which is gradually increased from the centers of the adjacent sides to the ends of the adjacent sides.

For example, as shown in FIG. 7, for adjacent sides of the red sub-pixel 110 and the green sub-pixel 120, the side of the red sub-pixel 110 has a curvature smaller than that of the side of the green sub-pixel 120. Therefore, for the adjacent sides of the red sub-pixel 110 and the green sub-pixel 120, the connecting line between two points at the adjacent sides and parallel to the length direction C has a length which is gradually increased from the centers of the adjacent sides to the ends of the adjacent sides. That is to say, the gap between the two adjacent sides is smallest at the middle part of the adjacent sides, and the gap becomes larger at the positions close to the ends of the adjacent sides.

In the present disclosure, the curvature is the rate of change of the angle through which the tangent to a curve turns in moving along the curve and which for a circle is equal to the reciprocal of the radius. For example, the curvature is the amount by which a curve deviates from being a straight line.

For example, although FIG. 7 is shown by taking an oval shape as an example, the embodiments of the disclosure is not strictly to the oval shape. For example, the oval shape comprises polygons with rounded angles which is formed by multiple sides and similar to an oval shape. For example, it may be a hexagon or an octagon with rounded angles.

For the blue sub-pixel 130 and the green sub-pixel 120 adjacent to each other, a minimum distance between two sides of the blue sub-pixel 130 opposite to each other along the length direction C of the green sub-pixel 120 is greater than a maximum size of the green sub-pixel 120. As illustrated in FIG. 7, two dotted lines that pass through two points nearest to each other on the two sides of the blue sub-pixel 130 opposite to each other are located at two sides of the green sub-pixel, respectively. For the red sub-pixel 110 and the green sub-pixel 120 adjacent to each other, a minimum distance between two sides of the red sub-pixel 110 opposite to each other along the width direction D of the green sub-pixel 120 is greater than the size of the green sub-pixel 120 in the width direction. As illustrated in FIG. 7, two dotted lines that pass through two points nearest to each other on the two sides of the red sub-pixel 110 opposite to each other are located at two sides of the green sub-pixel, respectively. It should be explained that, the three sub-pixels adjacent to each other illustrated in FIG. 7, i.e., the red sub-pixel, green sub-pixel and blue sub-pixel, are applicable for the pixel arrangement structure described in any of the embodiments above.

In some embodiments, as shown in FIG. 7, among the adjacent sides of the green sub-pixel 120 and the red sub-pixel 110, the curvature of the side of the green sub-pixel 120 is larger than that of the red sub-pixel 110; among the adjacent sides of the green sub-pixel 120 and the blue sub-pixel 130, the curvature of the side of the green sub-pixel 120 is larger than that of the side of the blue sub-pixel 130.

The foregoing embodiments are described with reference to the case where at least one of the red sub-pixel or the blue sub-pixel has a shape formed by taking a rhombus as a basic shape, with each side of the rhombus being inwardly concaved, by way of example. However, in the embodiments according to the present disclosure, at least one of the green sub-pixel or the blue sub-pixel may have other shapes such as a quadrangle with each side of the quadrangle being inwardly concaved.

In some embodiments, the virtual rhombuses corresponding to the red sub-pixel and the blue sub-pixel can be squares.

It can be known by referring FIGS. 5A-7 that the whole aperture ratio can be enhanced by appropriately making the sides of at least one of the red sub-pixel and the blue sub-pixel inwardly concaved. In some embodiments, the degree in which the sides are inwardly concaved is limited so as to avoid the red sub-pixel or the blue sub-pixel is too much reduced in their aperture ratio.

Figure 5B:
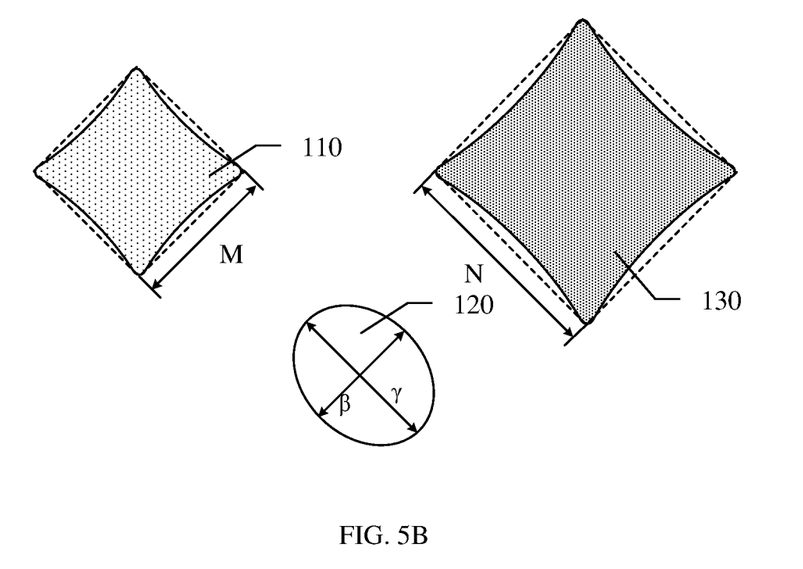

For example, the vertex angles of both the red sub-pixel and the blue sub-pixel are not larger than 90 degrees. As shown in FIG. 5B, the first virtual rhombus corresponding to the red sub-pixel 110 has a side length of M, the green sub-pixel has a first size $\beta$ along a third direction which is perpendicular to a direction in which the adjacent red and green sub-pixels are arranged, and the vertex angle $\alpha1$ of the red sub-pixel, the size $\beta$ and the side length M has the following relationship: $\tan[(90°-\alpha1)/2] \leq (M-\beta)/M$. For example, the second virtual rhombus corresponding to the blue sub-pixel has a side length of N, the green sub-pixel has a second size $\gamma$ along a fourth direction which is perpendicular to a direction in which the adjacent blue and green sub-pixels are arranged, and the vertex angle $\alpha2$ of the blue sub-pixel, the size $\gamma$ and the side length N has the following relationship: $\tan[(90°-\alpha2)/2] \leq (N-\gamma)/N$. It should be noted that the relationships are described herein by taking the first size $\beta$ and the second size $\gamma$ being not equal to each other as an example, but the embodiments of the disclosure are not limited thereto. For example, these relationships can also be applied to other situations such as a circle-shaped green sub-pixel as shown in the following FIG. 8. For example, as shown in FIG. 5B, the red sub-pixel 110 and the green sub-pixel 120 are adjacent to each other, and the blue sub-pixel 130 and the green sub-pixel 120 are adjacent to each other, the direction in which the adjacent red and green sub-pixels are arranged can refer to a direction of a line connecting the centers of the red and green sub-pixels, and the direction in which the adjacent blue and green sub-pixels are arranged can refer to a direction of a line connecting the centers of the blue and green sub-pixels. Furthermore, the first size $\beta$ and the second size $\gamma$ can also be the corresponding size of the green sub-pixel along two symmetry axes of the green sub-pixel. For example, the first size $\beta$ is the size along the longer symmetry axis of the green sub-pixel, and the second size $\gamma$ is the size along the shorter symmetry axis of the green sub-pixel. In the embodiment, the aperture ratios of sub-pixels of different colors can be adjusted so as to enhance the whole aperture ratio.

In some examples, $\tan[(90°-\alpha1)/2] \leq 0.25$; $\tan[(90°-\alpha2)/2] \leq 0.27$.

In some other examples, $\tan[(90°-\alpha1)/2] \leq 0.21$; $\tan[(90°-\alpha2)/2] \leq 0.23$.

In some examples, in the case the vertex angles of both the red sub-pixel and the blue sub-pixel are not larger than 90 degrees, the vertex angle of the red sub-pixel is no less than 64 degrees, and the vertex angle of the blue sub-pixel is no less than 60 degrees.

In some other examples, in the case the vertex angles of both the red sub-pixel and the blue sub-pixel are not larger than 90 degrees, the vertex angle of the red sub-pixel is no less than 66 degrees, and the vertex angle of the blue sub-pixel is no less than 64 degrees.

In some examples, the side length of the first virtual rhombus is in a range of 15 μm to 16 μm, the side length of the second virtual rhombus is in a range of 17.5 μm to 18.5 μm, the size of the green sub-pixel in the length direction is in a range from 13.5 μm to 14.5 μm, the size of the green sub-pixel in the width direction is in a range from 12 μm to 13 μm. For example, the side length of the first virtual rhombus is 15.2 μm, the side length of the second virtual rhombus is 18.3 μm, the size of the green sub-pixel in the length direction is 14 μm, the size of the green sub-pixel in the width direction is 12 μm.

Figure 8:
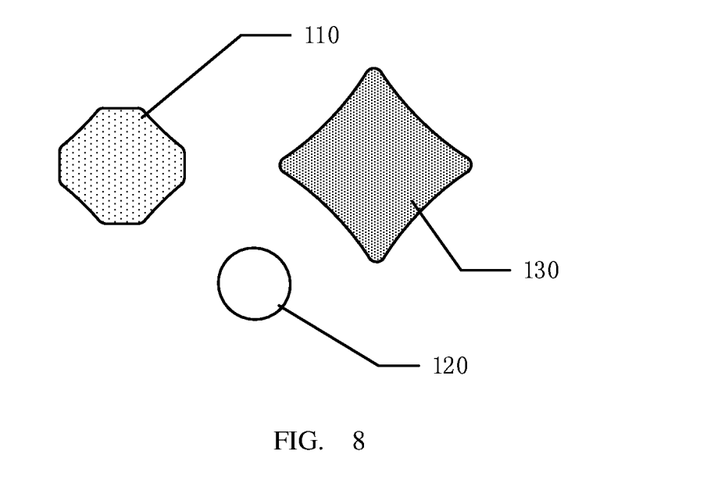
FIG. 8 is a partial plan view of a pixel arrangement structure provided by some embodiments of the present disclosure.

In some embodiments, at least one of the red sub-pixel or the blue sub-pixel may have other polygons with part of sides or each side of the polygon being inwardly concaved. In some examples, it may be a shape of an octagon in which four sides spaced from each other are inwardly concaved. As illustrated in FIG. 8, compared to the red sub-pixel in the embodiment above, the red sub-pixel 110 in the embodiment illustrated in FIG. 8 has a shape of an octagon in which four sides spaced from each other are inwardly concaved. For example, one vertex angle of the blue sub-pixel 130 is opposite to one straight side of the red sub-pixel 110. An extension direction of one pair of straight sides of the red sub-pixel 110 opposite to each other is parallel to the above-mentioned X direction; and an extension direction of the other pair of straight sides of the red sub-pixel 110 opposite to each other is parallel to the above-mentioned Y direction. For example, in the embodiment as illustrated in FIG. 8, the shape of the green sub-pixel is roughly a circle shape. It should be explained that, the red sub-pixel, green sub-pixel and blue sub-pixel illustrated in FIG. 8 are all applicable for the pixel arrangement structure described in any of the embodiments above. Therefore, the four sides of the red sub-pixel that are inwardly concaved may be opposite to four circle-shaped green sub-pixels, respectively.

Furthermore, as shown in FIG. 8, for the shape of the red sub-pixel 110, it can also be considered that the curvature at the vertex angle of the rhombus with inwardly concaved sides is modified to infinitely small. For example, the shape includes straight sides at the vertex angles. Alternatively, as shown in FIG. 8, for the shape of the red sub-pixel 110, it can also be considered that each vertex angle of the rhombus with inwardly concaved sides is cut so as to truncated pattern. Compared with the embodiments, the red sub-pixel can have a larger area in the case the requirement of the distances of adjacent sub-pixels is satisfied.

For example, in some embodiments, the aperture ratio of the red sub-pixels is in a range from 3.77% to 5.31%, the aperture ratio of the green sub-pixels is in a range from 4.92% to 5.72%, and the aperture ratio of the blue sub-pixels is in a range from 6.38% to 8.27%. The aperture ratio for the sub-pixels of each color refers to a ratio of the total aperture area of all the sub-pixels of each color to the area of the whole displaying area.

The following statements should be noted:

(1) The drawings accompanying the embodiments of the present disclosure involve only the structure(s) in connection with the embodiment(s) of the present disclosure, and other structure(s) can be referred to common design(s).

(2) In case of no conflict, the features in the same embodiment or in different embodiments can be combined with each other.

What have been described above are only specific implementations of the present disclosure, the protection scope of the present disclosure is not limited thereto. The protection scope of the present disclosure should be based on the protection scope of the claims.

What is claimed is:

1. A pixel arrangement structure, comprising:
a plurality of pixel groups, each of the plurality of pixel groups comprising one red sub-pixel, two green sub-pixels and one blue sub-pixel, the red sub-pixel and the blue sub-pixel being arranged along a first direction, the two green sub-pixels being arranged along a second direction, and a connecting line of a center of the red sub-pixel and a center of the blue sub-pixel being intersected with a connecting line of centers of the two green sub-pixels, wherein
four vertexes included in the red sub-pixel are located in a first virtual rhombus and are substantially coincident with four vertexes of the first virtual rhombus, respectively; four vertexes included in the blue sub-pixel are located in a second virtual rhombus and are substantially coincident with four vertexes of the second virtual rhombus, respectively;
each of the red sub-pixel or the blue sub-pixel has a shape of a corresponding virtual rhombus with each side of the corresponding virtual rhombus being an inwardly concaved side;
a side of the green sub-pixel that is adjacent to the inwardly concaved side is protruded towards the inwardly concaved side;
a vertex angle of the red sub-pixel and a vertex angle of the blue sub-pixel both are not larger than 90 degrees;
the first virtual rhombus has a side length of M, the vertex angle of the red sub-pixel is α1, the green sub-pixel has a first size β in a third direction which is perpendicular to a direction in which the adjacent red and green sub-pixels are arranged, and the vertex angle a1 of the red sub-pixel, the size β and the side length M has the following relationship: tan[(90°−α1)/2]≤(M−β)/M; and
the second virtual rhombus has a side length of N, the vertex angle of the blue sub-pixel is α2, the green sub-pixel has a second size γ in a fourth direction which is perpendicular to a direction in which the adjacent blue and green sub-pixels are arranged, and the vertex angle α2 of the blue sub-pixel, the size y and the side length N has the following relationship: tan[(90°−α2)/2]≤(N−γ)/N,
an area of the green sub-pixel is larger than an area of an ellipse with a major axis length of γ and a minor axis length of β,
a curvature of the side of the red sub-pixel is smaller than a curvature of the side of the blue sub-pixel.

2. The pixel arrangement structure according to claim 1, wherein a minimum distance between a side of the red sub-pixel and a side of the green sub-pixel that are adjacent to each other is equal to a minimum distance between a side of the blue sub-pixel and a side of the green sub-pixel that are adjacent to each other.

3. The pixel arrangement structure according to claim 2, wherein both the red sub-pixel and the blue sub-pixel have a shape of a corresponding virtual rhombus with each side of the corresponding virtual rhombus being inwardly concaved as a cambered side.

4. The pixel arrangement structure according to claim 2, wherein a minimum distance between the red sub-pixel and the blue sub-pixel is substantially equal to a minimum distance between a side of the red sub-pixel and a side of the green sub-pixel that are adjacent to each other, and substantially equal to a minimum distance between a side of the blue sub-pixel and a side of the green sub-pixel that are adjacent to each other,
two diagonal lines of the first virtual rhombus are parallel to the first direction and the second direction, respectively, and two diagonal lines of the second virtual rhombus are parallel to the first direction and the second direction, respectively.

5. The pixel arrangement structure according to claim 1, wherein a side of the green sub-pixel and a side of the red sub-pixel that are adjacent to each other have contours which are substantially complementary with each other, and
a side of the green sub-pixel and a side of the blue sub-pixel that are adjacent to each other have contours which are substantially complementary with each other.

6. The pixel arrangement structure according to claim 1, wherein for the adjacent sides of the green sub-pixel and the red sub-pixel, the side of the green sub-pixel has a curvature larger than that of the side of the red sub-pixel; for the adjacent sides of the green sub-pixel and the blue sub-pixel, the side of the green sub-pixel has a curvature larger than that of the side of the blue sub-pixel.

7. The pixel arrangement structure according to claim 1, wherein a vertex angle of the blue sub-pixel is smaller than a vertex angle of the red sub-pixel.

8. The pixel arrangement structure according to claim 1, wherein a shape of the red sub-pixel and a shape of the blue sub-pixel are similar patterns.

9. The pixel arrangement structure according to claim 8, wherein the green sub-pixel comprises a long axis and a short axis,
the long axis is parallel to an arrangement direction of the green sub-pixel and the red sub-pixel, and
the short axis is parallel to an arrangement direction of the green sub-pixel and the blue sub-pixel.

10. The pixel arrangement structure according to claim 9, wherein, wherein an area of each blue sub-pixel and an area of each red sub-pixel both are greater than an area of each green sub-pixel.

11. The pixel arrangement structure according to claim 9, wherein for the green sub-pixel and the blue sub-pixel that are adjacent to each other, a connecting line that connects two points on adjacent sides of the green sub-pixel and the blue sub-pixel and that is parallel to a direction from a center of the green sub-pixel to a center of the blue sub-pixel has a length which is gradually increased in a direction from centers of the adjacent sides to both ends of the adjacent sides.

12. The pixel arrangement structure according to claim 1, wherein one of the red sub-pixel and the blue sub-pixel has a shape of a corresponding virtual rhombus with each side of the corresponding virtual rhombus being inwardly concaved as a cambered side, and each of sides of the other one of the red sub-pixel and the blue sub-pixel is substantially a straight side.

13. The pixel arrangement structure according to claim 1, wherein for the blue sub-pixel and the green sub-pixel that are adjacent to each other, a direction from a center of the green sub-pixel to a center of the blue sub-pixel is substantially perpendicular to the length direction of the green sub-pixel, and for the red sub-pixel and the green sub-pixel that are adjacent to each other, a direction from a center of the green sub-pixel to a center of the red sub-pixel is substantially perpendicular to the width direction of the green sub-pixel.

14. The pixel arrangement structure according to claim 13, wherein for the blue sub-pixel and the green sub-pixel that are adjacent to each other, a minimum distance between two sides of the blue sub-pixel that are opposite to each other along the length direction of the green sub-pixel is greater than the maximum size of the green sub-pixel, and for the red sub-pixel and the green sub-pixel that are adjacent to each other, a minimum distance between two sides of the red sub-pixel that are opposite to each other along the width direction of the green sub-pixel is greater than a size of the green sub-pixel along the width direction.

15. The pixel arrangement structure according to claim 1, wherein the vertex angle of the red sub-pixel is in a range from 64 degrees to 90 degrees, and the vertex angle of the blue sub-pixel is in a range from 60 degrees to 90 degrees.

16. A display substrate, comprising:
a base substrate; and
the pixel arrangement structure according to claim 1, located on the base substrate.

17. A pixel arrangement structure, comprising:
a plurality of pixel groups, each of the plurality of pixel groups comprising one red sub-pixel, two green sub-pixels and one blue sub-pixel, the red sub-pixel and the blue sub-pixel being arranged along a first direction, the two green sub-pixels being arranged along a second direction, and a connecting line of a center of the red sub-pixel and a center of the blue sub-pixel being intersected with a connecting line of centers of the two green sub-pixels, wherein four vertexes included in the red sub-pixel are located in a first virtual rhombus and are substantially coincident with four vertexes of the first virtual rhombus, respectively; four vertexes included in the blue sub-pixel are located in a second virtual rhombus and are substantially coincident with four vertexes of the second virtual rhombus, respectively;

the red sub-pixel has a shape of square with rounded angles, the blue sub-pixel has a shape of a corresponding virtual rhombus with each side of the corresponding virtual rhombus being an inwardly concaved side;

a side of the green sub-pixel that is adjacent to the inwardly concaved side is protruded towards the inwardly concaved side;

a vertex angle of the red sub-pixel and a vertex angle of the blue sub-pixel both are not larger than 90 degrees;

the first virtual rhombus has a side length of M, the vertex angle of the red sub-pixel is $\alpha 1$, the green sub-pixel has a first size $\beta$ in a third direction which is perpendicular to a direction in which the adjacent red and green sub-pixels are arranged, and the vertex angle a1 of the red sub-pixel, the size $\beta$ and the side length M has the following relationship: $\tan[(90°-\alpha 1)/2] \leq (M-\beta)/M$; and the second virtual rhombus has a side length of N, the vertex angle of the blue sub-pixel is $\alpha 2$, the green sub-pixel has a second size $\gamma$ in a fourth direction which is perpendicular to a direction in which the adjacent blue and green sub-pixels are arranged, and the vertex angle $\alpha 2$ of the blue sub-pixel, the size y and the side length N has the following relationship: $\tan[(90°-\alpha 2)/2] \leq (N-\gamma)/N$, an area of the green sub-pixel is larger than an area of an ellipse with a major axis length of $\gamma$ and a minor axis length of $\beta$.

* * * * *